US012480981B2

(12) United States Patent
Gelman et al.

(10) Patent No.: US 12,480,981 B2
(45) Date of Patent: Nov. 25, 2025

(54) VOLTAGE SENSOR WITH IN-RANGE CHECK FOR SAFETY-CRITICAL APPLICATIONS

(71) Applicant: QUALCOMM Incorporated, San Diego, CA (US)

(72) Inventors: Anatoly Gelman, San Diego, CA (US); Felipe Regis Goncalves Cabral, Crosshaven (IE); Mingcheng Zhu, San Diego, CA (US); Amit Aneja, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 167 days.

(21) Appl. No.: 18/442,774

(22) Filed: Feb. 15, 2024

(65) Prior Publication Data

US 2025/0264505 A1     Aug. 21, 2025

(51) Int. Cl.
    *G01R 19/165*     (2006.01)
    *G01R 19/25*     (2006.01)
    *H03K 3/03*     (2006.01)

(52) U.S. Cl.
    CPC ........ *G01R 19/1659* (2013.01); *G01R 19/25* (2013.01); *H03K 3/0315* (2013.01)

(58) Field of Classification Search
None
See application file for complete search history.

(56) References Cited

U.S. PATENT DOCUMENTS

| 7,307,486 | B2* | 12/2007 | Pernia ...................... H03L 3/00 |
| | | | 331/177 V |
| 7,774,627 | B2* | 8/2010 | Gaskins ................ G06F 1/3296 |
| | | | 713/320 |
| 8,130,044 | B2* | 3/2012 | Bereza ...................... H03L 7/18 |
| | | | 331/49 |
| 9,712,168 | B1* | 7/2017 | Samson ........... H03K 19/00369 |
| 10,288,496 | B1* | 5/2019 | Wesselkamper ... G01R 19/0084 |
| 11,556,890 | B2* | 1/2023 | Barrenscheen .......... H04Q 9/02 |
| 11,585,854 | B1* | 2/2023 | Cheng .............. H03K 19/00369 |
| 12,347,353 | B2* | 7/2025 | Min ...................... G09G 3/3291 |
| 2005/0057287 | A1* | 3/2005 | Gossmann ........... H03K 17/223 |
| | | | 327/143 |
| 2005/0135456 | A1* | 6/2005 | Lee ........................ G01K 15/00 |
| | | | 374/E11.003 |
| 2006/0071734 | A1* | 4/2006 | McCorquodale ...... H03B 5/124 |
| | | | 331/176 |

(Continued)

*Primary Examiner* — Fekadeselassie Girma
(74) *Attorney, Agent, or Firm* — Loza & Loza LLP (57) ABSTRACT

Aspects of the disclosure are directed to voltage sensing for safety-critical applications. In accordance with one aspect, the disclosure includes a multi-phase ring oscillator (RO) configured to operate in a first voltage domain; a frequency counter coupled to the multi-phase RO, the frequency counter configured to accumulate a plurality of phase cycles from the multi-phase RO over a time duration to generate a digital count word; an alarm processor coupled to the frequency counter, the alarm processor configured to receive an alarm state signal from the frequency counter; and a heartbeat detector coupled to the multi-phase RO, the heartbeat detector configured to operate in a second voltage domain and configured to detect a periodic recurrence of a heartbeat pulse to determine an integrity of the sensor function as a whole and alarm state signal in particular.

14 Claims, 7 Drawing Sheets

(56) References Cited

U.S. PATENT DOCUMENTS

| | | | | |
|---|---|---|---|---|
| 2007/0001771 | A1* | 1/2007 | Hori | H03K 5/133 331/57 |
| 2008/0278223 | A1* | 11/2008 | Kernahan | H03H 11/265 323/267 |
| 2010/0246221 | A1* | 9/2010 | Sahu | H02M 3/1584 363/78 |
| 2011/0074398 | A1* | 3/2011 | Barton | G01R 19/252 324/133 |
| 2012/0307867 | A1* | 12/2012 | Chung | G01R 19/0084 374/170 |
| 2014/0097858 | A1* | 4/2014 | Ding | G01R 31/2824 324/750.01 |
| 2015/0295562 | A1* | 10/2015 | Agarwal | G01N 33/0047 73/23.3 |
| 2017/0214399 | A1 | 7/2017 | Zogopoulos et al. | |
| 2018/0089052 | A1* | 3/2018 | Igarashi | G11C 29/021 |
| 2019/0207591 | A1* | 7/2019 | Choi | H03K 3/0315 |
| 2019/0265767 | A1 | 8/2019 | Mehra et al. | |
| 2019/0317547 | A1* | 10/2019 | Savoj | G01K 7/01 |
| 2019/0379363 | A1* | 12/2019 | Ahmed | G01K 7/32 |
| 2020/0081757 | A1* | 3/2020 | Ota | G06F 11/1004 |
| 2020/0089299 | A1* | 3/2020 | Kim | H03L 7/0997 |
| 2020/0249713 | A1* | 8/2020 | Nadershahi | H03K 3/84 |
| 2021/0382093 | A1 | 12/2021 | Allen et al. | |
| 2022/0057452 | A1* | 2/2022 | Gorbold | G01R 31/3167 |
| 2022/0069835 | A1* | 3/2022 | Verma | H03M 1/1245 |
| 2022/0103123 | A1* | 3/2022 | Higuchi | H03B 5/326 |
| 2022/0120825 | A1 | 4/2022 | Ahlers et al. | |
| 2022/0284099 | A1 | 9/2022 | Jansman et al. | |
| 2024/0146243 | A1* | 5/2024 | Sato | H03B 5/36 |
| 2025/0044328 | A1* | 2/2025 | Kim | G01R 19/175 |
| 2025/0180609 | A1* | 6/2025 | Dabbagh Sadeghipour | G01R 19/16552 |
| 2025/0264505 | A1* | 8/2025 | Gelman | G01R 19/1659 |

\* cited by examiner

VOLTAGE SENSOR WITH IN-RANGE CHECK FOR SAFETY-CRITICAL APPLICATIONS

TECHNICAL FIELD

This disclosure relates generally to the field of voltage sensing, and, in particular, to voltage sensing for safety-critical applications.

BACKGROUND

Many applications rely on a voltage sensor of a DC voltage supply to determine if a current operational state is nominal (that is, within normal operational conditions) or is anomalous, (that is, outside normal operational conditions). For example, an anomalous operational condition may occur when a supply voltage is in an overvoltage condition or is in an undervoltage condition. However, in some examples, the voltage sensor may not be a reliable monitor of the current operational state if its functioning depends on the DC voltage supply it monitors. As a result, there is a desire for a voltage sensor of a DC voltage supply which can reliably detect either on overvoltage condition or an undervoltage condition, particularly in safety-critical applications, such as automotive electronics monitoring applications.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides voltage sensing for safety-critical applications. Accordingly, an apparatus including: a multi-phase ring oscillator (RO) configured to operate in a first voltage domain; a frequency counter coupled to the multi-phase RO, the frequency counter configured to accumulate a plurality of phase cycles from the multi-phase RO over a time duration to generate a digital count word; an alarm processor coupled to the frequency counter, the alarm processor configured to receive an alarm state signal from the frequency counter; and a heartbeat detector coupled to the multi-phase RO, the heartbeat detector configured to operate in a second voltage domain and configured to detect a periodic recurrence of a heartbeat pulse to determine an integrity of the alarm state signal and an overall sensor operation.

In one example, the alarm processor is configured to operate in the second voltage domain. In one example, the frequency counter is configured to operate in the first voltage domain. In one example, the second voltage domain is separate from the first voltage domain. In one example, the second voltage domain includes higher integrity voltage supplies with higher availability and higher reliability than in the first voltage domain. In one example, the alarm state signal indicates an overvoltage condition or an undervoltage condition, and an analog-to-digital converter (ADC) code. In one example, the ADC code represents the digital count word.

In one example, the apparatus further includes a frequency divider coupled to the heartbeat detector, the frequency divider configured to generate a heartbeat signal. In one example, the multi-phase RO, the frequency counter and the frequency divider are housed in a monitored subsystem. In one example, the heartbeat signal includes a recurrence of the heartbeat pulse to indicate that the monitored subsystem is functional.

Another aspect of the disclosure provides a method including: generating an alarm state signal from a digital count word and a comparator state signal; generating a heartbeat signal by dividing down one of a plurality of multi-phase ring oscillator (RO) output waveforms; and generating an error interrupt signal and a warning interrupt signal in a voltage domain based on the alarm state signal and the heartbeat signal.

In one example, the comparator state signal is based on a comparison between the digital count word and a count threshold. In one example, the alarm state signal indicates an overvoltage condition or an undervoltage condition, and an analog-to-digital converter (ADC) code. In one example, the ADC code represents the digital count word. In one example, the heartbeat signal has greater timing margin than the alarm state signal.

In one example, the method further includes accumulating a plurality of phase cycles from a multi-phase ring oscillator (RO) over a time duration to generate the digital count word. In one example, the method further includes generating the plurality of multi-phase RO output waveforms, wherein the plurality of multi-phase RO output waveforms includes a common ring oscillator (RO) output frequency $F_0$. In one example, each of the plurality of multi-phase RO output waveforms has a different waveform phase value.

In one example, the method further includes using the digital count word to determine the common RO output frequency $F_0$. In one example, the method further includes initializing the multi-phase ring oscillator (RO) and a frequency counter in another voltage domain. In one example, the method further includes receiving a sensed voltage from a DC voltage supply.

In one example, the sensed voltage is from the another voltage domain. In one example, the another voltage domain is separate from the voltage domain. In one example, the voltage domain includes higher integrity voltage supplies with higher availability and higher reliability than in the another voltage domain.

In one example, the method further includes detecting a periodic recurrence of a heartbeat pulse at a rate equivalent to a divided output frequency $F_d$. In one example, the divided output frequency $F_d$ is related to the common RO output frequency $F_0$ by a dividing integer. In one example, the method further includes processing an alarm when a heartbeat detector indicates an in-range condition.

Another aspect of the disclosure provides an apparatus for voltage sensing, the apparatus including: generating an alarm state signal from a digital count word and a comparator state signal; generating a heartbeat signal by dividing down one of a plurality of multi-phase ring oscillator (RO) output waveforms in a first voltage domain; generating an error interrupt signal and a warning interrupt signal in a second voltage domain based on the alarm state signal and the heartbeat signal; and accumulating a plurality of phase cycles from a multi-phase ring oscillator (RO) over a time duration to generate the digital count word; wherein the heartbeat signal has greater timing margin than the alarm state signal, and wherein each of the plurality of multi-phase RO output waveforms has a different waveform phase value.

In one example, the second voltage domain is separate from the first voltage domain, and wherein the second voltage domain includes higher integrity voltage supplies with higher availability and higher reliability than in the first voltage domain.

Another aspect of the disclosure provides a non-transitory computer-readable medium storing computer executable code, operable on a device including at least one processor and at least one memory coupled to the at least one processor, wherein the at least one processor is configured to implement voltage sensing, the computer executable code including: instructions for causing a computer to generate an alarm state signal from a digital count word and a comparator state signal; instructions for causing the computer to generate a heartbeat signal by dividing down one of a plurality of multi-phase ring oscillator (RO) output waveforms in a first voltage domain; instructions for causing the computer to generate an error interrupt signal and a warning interrupt signal in a second voltage domain based on the alarm state signal and the heartbeat signal; and instructions for causing the computer to accumulate a plurality of phase cycles from a multi-phase ring oscillator (RO) over a time duration to generate the digital count word; wherein the heartbeat signal has greater timing margin than the alarm state signal, and wherein each of the plurality of multi-phase RO output waveforms has a different waveform phase value.

In one example, the second voltage domain is separate from the first voltage domain, and wherein the second voltage domain includes higher integrity voltage supplies with higher availability and higher reliability than in the first voltage domain.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 1:
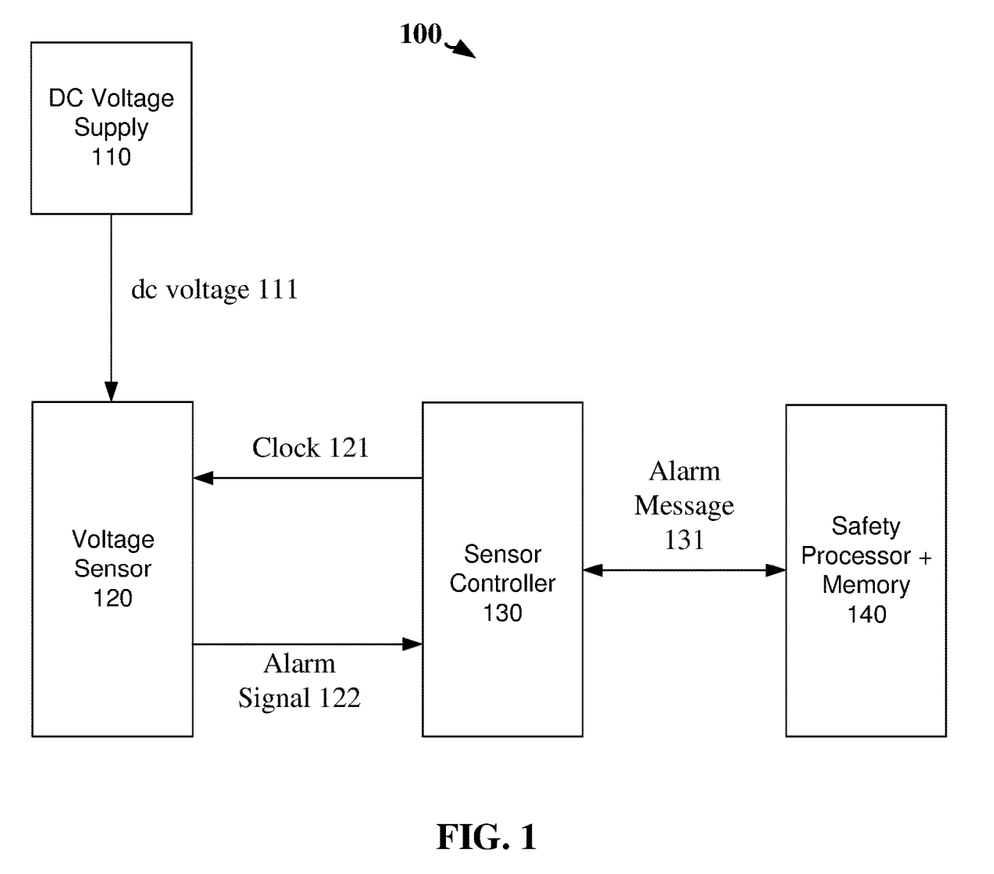
FIG. 1 illustrates a first example voltage sensor implementation.

FIG. 1 illustrates a first example voltage sensor implementation 100. In one example, a DC voltage supply 110 provides a DC voltage 111 for an electronic system. In one example, the DC voltage supply 110 also provides the DC voltage 111 to a voltage sensor 120. In one example, the voltage sensor 120 monitors the DC voltage 111 with a clock reference 121 provided as an input and an alarm signal 122 provided as an output. In one example, a sensor controller 130 receives the alarm signal 122 and determines if an alarm message 131 is sent to a safety processor 140 for alarm adjudication.

In one example, the voltage sensing architecture 100 may be used for monitoring of DC voltage supply rails and provides both overvoltage alarms and undervoltage alarms. In one example, the sensor controller 130, which includes voltage alarm logic, is operational itself only within a specific DC voltage range due to utilization of digital circuitry. In one example, the voltage sensing architecture 100 may provide a slow dynamic in-range indication of valid alarm outputs. For example, the voltage sensing architecture 100 may be suitable for automotive applications where the voltage sensor 120 is functionally independent of the DC voltage supply rails being monitored.

In one example, a DC voltage monitoring solution is independent of the voltage domains it is expected to monitor. For example, a fault in the DC voltage supply rails, which is being monitored, may not cascade to the DC voltage monitoring solution. In one example, independence from the monitored voltage domains facilitates functional safety compliance for various applications and use cases.

In one example, the DC voltage monitoring solution may have a higher safety integrity level (e.g., ASIL D per ISO26262) against a safety integrity level associated with the voltage domains being monitored (e.g., ASIL B per ISO26262). In one example, ASIL refers to an automotive safety integrity level out of four possible levels (i.e., A, B, C, D), with ASIL D denoting the highest safety integrity level and ASIL B denoting the third highest safety integrity level.

In one example, digital alarm outputs, analog-to-digital converter (ADC) code outputs, sensor internal logic, etc. may be frozen or malfunctioning if sensor logic is not within a designed DC voltage range. In one example, if the sensor logic is not within a designed DC voltage range, a loss of monitoring or faulty monitoring may result.

In one example, a voltage sensor may be implemented using a ring oscillator, in particular a ring oscillator (RO)-based voltage sensor with a multi-phase counter. In one example, the voltage sensor monitors an RO output waveform with an RO output frequency $F_0$. For example, the RO may be implemented as a cascade of an odd number of inverter logic states with feedback from output to input. For example, the RO output frequency $F_0$ may depend on a quantity of inverter logic stages M, a single stage time delay $\tau$ and an RO supply voltage V.

In one example, the RO output frequency $F_0$ may be given by: $F_0 = 1/(2\tau M)$. For example, the RO output frequency $F_0$ may be inversely proportional to the quantity of inverter logic stages M. For example, the RO output frequency $F_0$ may be inversely proportional to the single stage time delay. For example, the single stage time delay may be inversely dependent on the RO supply voltage V. In one example, as a consequence of these relationships, the RO output frequency $F_0$ may be monotonically dependent on the RO supply voltage. That is, as the RO supply voltage increases, the RO output frequency $F_0$ increases. That is, as the RO supply voltage decreases, the RO output frequency $F_0$ decreases. Therefore, monitoring of the RO output frequency $F_0$ may provide an implicit monitoring of the RO supply voltage V.

In one example, monitoring of the RO output frequency $F_0$ may be performed by a counter. For example, the counter increments a count state whenever the RO output waveform has a positive zero crossing or a negative zero crossing. In one example, the positive zero crossing is a rising edge transition. In one example, the negative zero crossing is a falling edge transition. That is, the counter records an accumulation of phase cycles (i.e., accumulation of count state increments) of the RO output waveform over a defined time period. In one example, the accumulation of phase cycles of the RO output waveform may be used to determine the RO output frequency $F_0$. That is, the accumulation of count state increments of the counter may be used to determine the RO supply voltage V.

In one example, the accumulation of phase cycles from the counter may be formatted into a digital count word with Q bits. For example, the digital count word may represent a quantization of the RO output frequency. That is, the digital code word may be interpreted as a digital approximation of an actual RO output frequency, measured in Hertz. In one example, the digital count word may be referred as an analog-to-digital converter (ADC) code word.

In one example, the RO-based voltage sensor with multi-phase counter in a first voltage domain (i.e., a monitored domain) may be deployed with alarm logic in a second voltage domain (e.g., a safety processor domain). In one example, a heartbeat output derived from the RO-based voltage sensor may be observed in the second voltage domain and may provide an in-range indication of the RO supply voltage V.

In one example, the heartbeat signal may be implemented as a divided-down derivative from the RO output waveform. In one example, the heartbeat signal may be used as a sensor liveness check and a health/range check of the RO-based voltage sensor. For example, if the heartbeat signal indicates a healthy sensor, a sensor alarm signal from the alarm logic may be trusted. In one example, a heartbeat signal score may be used as a low-bandwidth voltage reading.

In one example a safety processor may be deployed in the second voltage domain (e.g., the safety processor voltage domain). In one example, the safety processor confirms that the heartbeat signal score is within a target operational range prior to observing the sensor alarm signal. In one example, once observation of the sensor alarm signal is enabled, the heartbeat signal is continuously monitored.

In one example, the RO-based voltage sensor with multi-phase counter establishes independence between the first voltage domain (i.e., the monitored domain) and the second voltage domain (i.e., the safety processor domain). In one example, fault propagation from the first voltage domain to the second voltage domain may be avoided.

In one example, a redundant voltage sensor/sensor controller architecture may be implemented for the RO-based voltage monitor. In one example, a first voltage sensor may be coupled to a first sensor controller, and a second voltage sensor may be coupled to the second sensor controller. In one example, in a redundant architecture, either one voltage sensor or one sensor controller may fail independently while still allowing voltage monitoring by another voltage sensor/sensor controller pair. In one example, the redundant architecture relies on redundancy between the first voltage sensor and the second voltage sensor in the first voltage domain and between the first sensor controller and the second voltage controller in the second voltage domain. In one example, the first voltage sensor and the second voltage sensor in the first voltage domain are separated from the first sensor controller and the second voltage controller in the second voltage domain. In one example, separation implies voltage supply isolation.

In one example, the separation between the first voltage domain and the second voltage domain allows an elevation of a safety integrity level for the RO-based voltage sensor with multi-phase counter. For example, an independent voltage supply of the voltage sensor may be associated with a safety integrity level denoted as ASIL D. For example, the RO-based voltage sensor may be developed with integral safety features to achieve a higher ASIL safety integrity level up to ASIL D which supports applications with stringent safety requirements.

Figure 2:
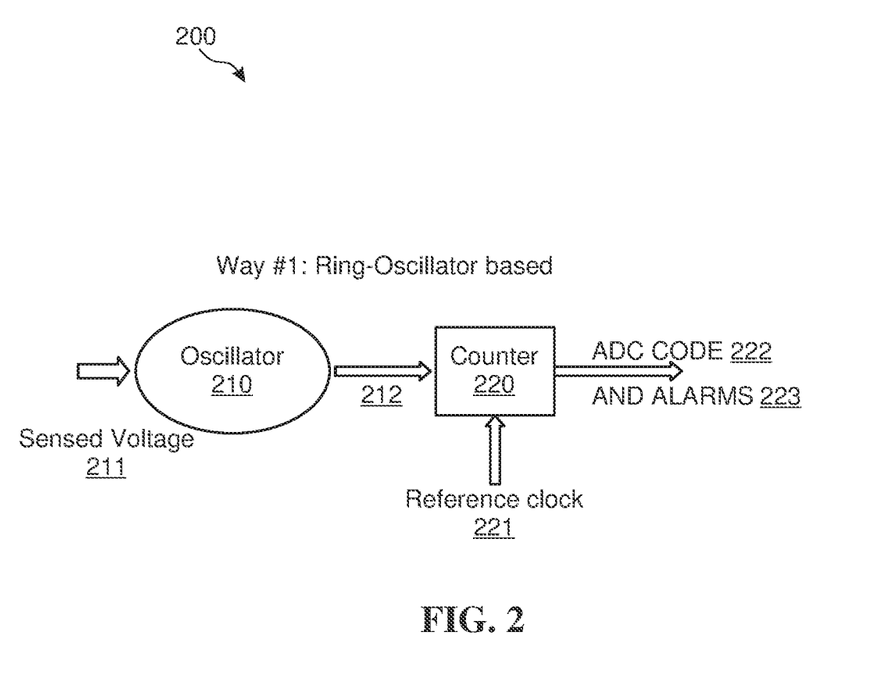
FIG. 2 illustrates a second example voltage sensor implementation with a first ring oscillator which operates with a first sensed voltage and which outputs a first RO output waveform.

FIG. 2 illustrates a second example voltage sensor implementation 200 with a first ring oscillator 210 which operates with a first sensed voltage 211 and which outputs a first RO output waveform 212. In one example, the first RO output waveform 212 is a single phase waveform. In one example, the first RO output waveform 212 is monitored by a first counter 220 with a first reference clock 221. In one example, the first counter 220 has a first ADC code output 222 and a first alarm output signal 223. In one example, the first ADC code output 222 provides a count of zero crossings or edge transitions for the first RO output waveform 212. In one example, the first alarm output signal 223 provides an alarm indication based on the first ADC code output 222. In one example, the first example voltage sensor implementation 200 has a slow response characteristic, and operation of the first counter 220 relies on the sensed voltage 211.

Figure 3:
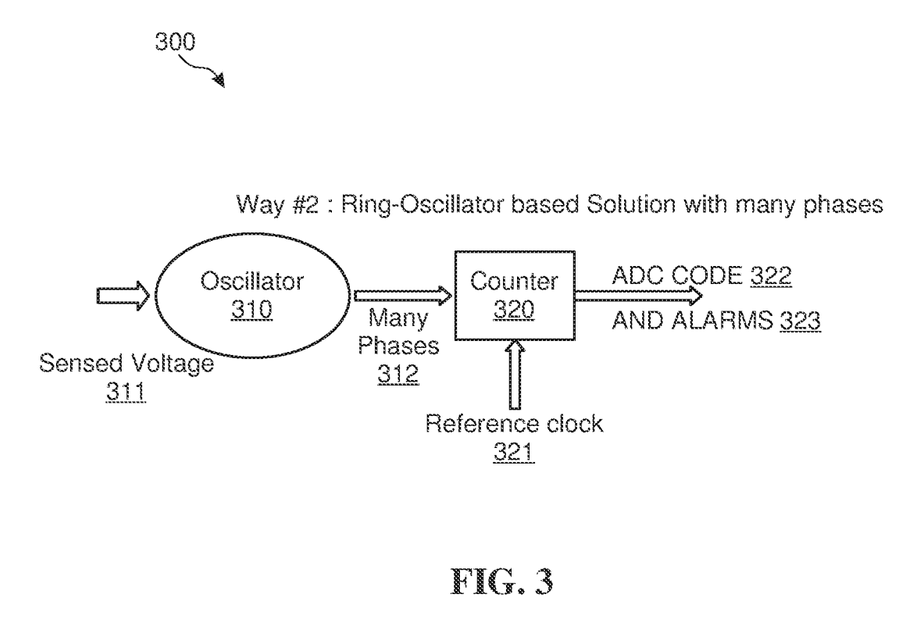
FIG. 3 illustrates a third example voltage sensor implementation with a second ring oscillator which operates with a second sensed voltage and which outputs a second RO output waveform.

FIG. 3 illustrates a third example voltage sensor implementation 300 with a second ring oscillator 310 which operates with a second sensed voltage 311 and which outputs a second RO output waveform 312. In one example, the second RO output waveform 312 is a multi-phase waveform. In one example, the second RO output waveform 312 is monitored by a second counter 320 with a second reference clock 321. In one example, the second counter 320 has a second ADC code output 322 and a second alarm output signal 323. In one example, the second ADC code output 322 provides a count of zero crossings or edge transitions for the second RO output waveforms 312 produced by a plurality of phases of RO. In one example, the second alarm output signal 323 provides an alarm indication based on the second ADC code output 322. In one example, operation of the second counter 320 relies on the sensed voltage 311.

Figure 4:
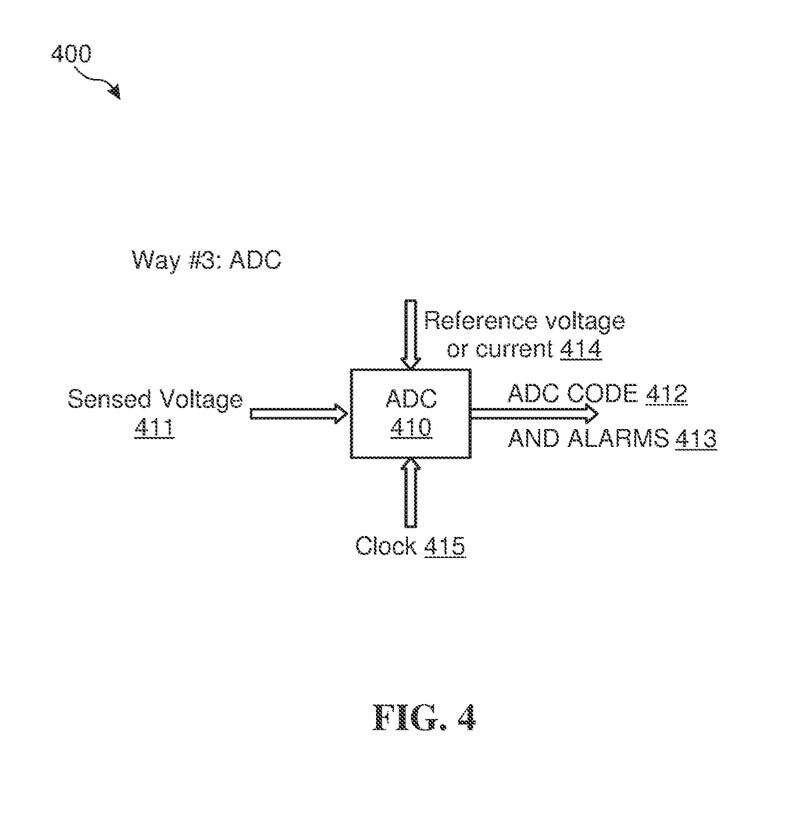
FIG. 4 illustrates a fourth example voltage sensor implementation with an analog-to-digital converter (ADC) which operates with a third sensed voltage and which outputs a third ADC code output and a third alarm output signal.

FIG. 4 illustrates a fourth example voltage sensor implementation 400 with an analog-to-digital converter (ADC) 410 which operates with a third sensed voltage 411 and which outputs a third ADC code output 412 and a third alarm output signal 413. In one example, the ADC uses a reference voltage or current 414 for calibration and uses a third reference clock 415. In one example, the third alarm output signal 413 provides an alarm indication based on the third ADC code output 412. In one example, operation of the ADC 410 relies on the third sensed voltage 411. In one example, the third voltage sensor implementation 400 has a slower response than an RO-based voltage sensor, is dependent on the sensed voltage 411, is less cost efficient and requires a reference voltage or current 414 for calibration.

Figure 5:
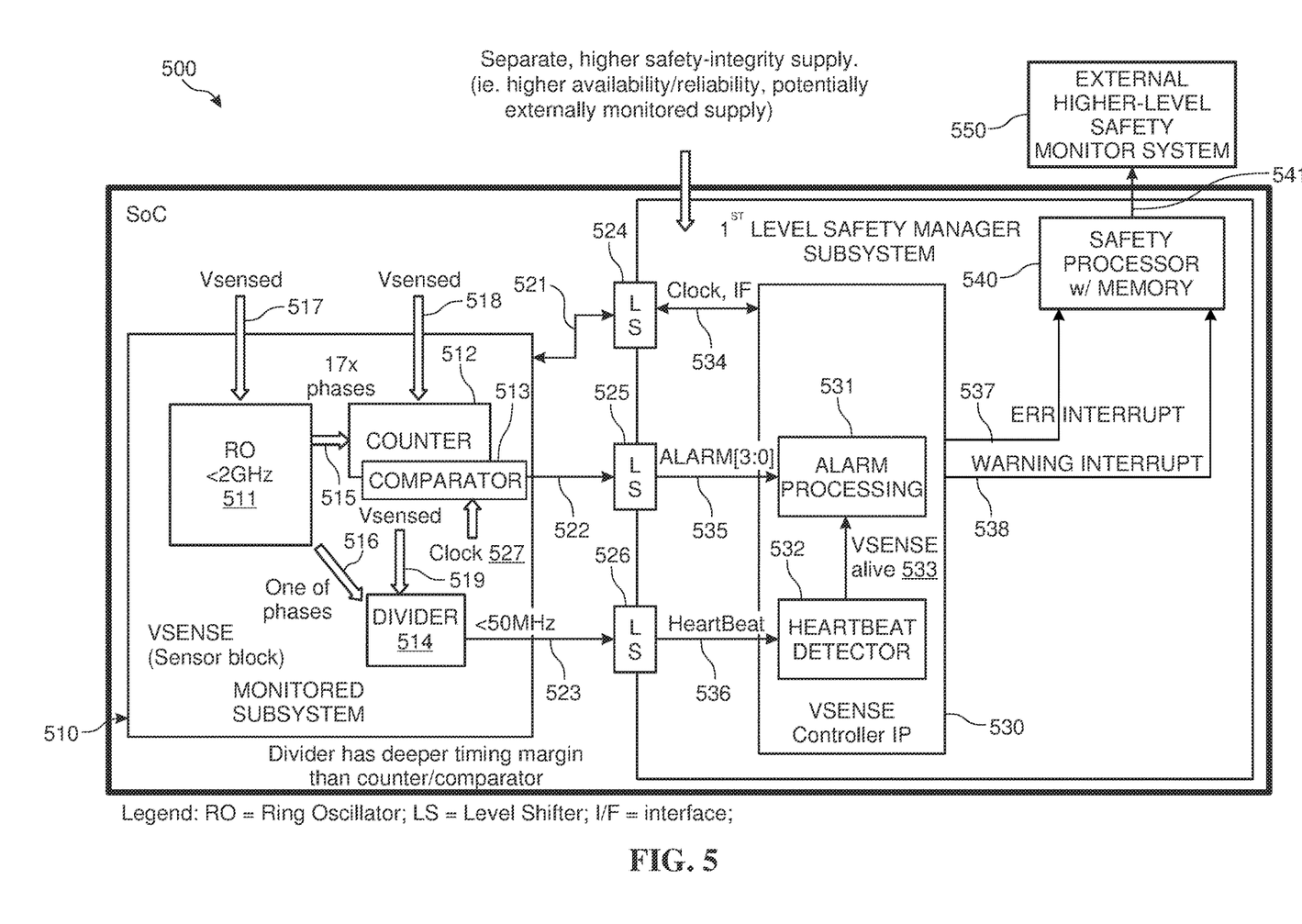
FIG. 5 illustrates a fifth example voltage sensor implementation.

FIG. 5 illustrates a fifth example voltage sensor implementation 500. In one example, a ring oscillator (RO) 511 in a monitored subsystem 510 provides a plurality of multi-phase RO output waveforms 515. In one example, the plurality of multi-phase RO output waveforms 515 is a plurality of K periodic waveforms $s_1(t), s_2(t), s_3(t), \ldots s_K(t)$, each at a common RO output frequency $F_0$ and each with a different waveform phase value $\phi_1, \phi_2, \phi_3, \ldots \phi_K$, respectively. In one example, the different waveform phase values $\phi_1, \phi_2, \phi_3, \ldots \phi_K$ are equally spaced over a unit circumference ranging from 0 to $2\pi$ radians (i.e., 0 to one full cycle).

In one example, a plurality of 17 periodic waveforms with different waveform phase values equally spaced an increment delta apart (e.g., delta=$2\pi/17$ radians apart) corresponds to 17 unique periodic waveforms. In one example, the 17 periodic waveforms have phase values equally spaced around the unit circumference. In one example, the plurality of 17 periodic waveforms are generated using a plurality of RO stages from the RO 511.

In one example, the RO 511 receives a first sensed voltage 517 from a first DC voltage supply. In one example, the first sensed voltage 517 is from a first voltage domain.

In one example, the plurality of multi-phase RO output waveforms 515 with the common RO output frequency $F_0$ is sent to a frequency counter 512 for counting of phase cycles. The frequency counter 512 provides an accumulation of phase cycles of the common RO output frequency $F_0$ (i.e., accumulation of count state increments) over a time duration. The frequency counter 512 is coupled to a comparator 513 and to a reference clock 527. In one example, the time duration is determined by the reference clock 537.

In one example, the comparator 513 compares the accumulation of phase cycles to a count threshold and supplies a comparator state signal 522 to a first level shifter (LS) 525.

In one example, an alarm state signal 535 is based on the accumulation of phase cycles over the time duration of the sensed voltage 518. In one example, the alarm state signal 535 is formatted as a digital count word with Q bits of resolution and generated by the monitored subsystem 510. In one example, the comparator state signal 522 determines the alarm state signal 535. For example, the alarm state signal 535 indicates an overvoltage alarm, an undervoltage alarm, or other alarms. In one example, the accumulation of phase cycles may be represented as an ADC code word with R bits of resolution.

In one example, the frequency counter 512 and the comparator 513 receive a second sensed voltage 518 from the first DC voltage supply. In one example, the second sensed voltage 518 is from the first voltage domain. In one example, the first sensed voltage 517 and the second sensed voltage 518 are the same sensed voltage from the first DC voltage supply.

In one example, the RO 511 also provides a single-phase RO output waveform 516 with the common RO output frequency $F_0$. In one example, the single-phase RO output waveform 516 is one of the plurality of multi-phase RO output waveforms 515. In one example, the single-phase RO output waveform 516 with the common RO output frequency $F_0$ is sent to a frequency divider 514. In one example, the frequency divider 514 inputs the single-phase RO output waveform 516 with the common RO output frequency $F_0$ and produces a divided output waveform 523 with a divided output frequency $F_d$. In one example, the divided output frequency $F_d$ is related to the common RO output frequency $F_0$ by a dividing integer P. For example, $F_d = F_0/P$. For example, if $F_0 = 2000$ MHz and P=40, then the divided output frequency $F_d = 50$ MHz.

In one example, the frequency divider 514 receives a third sensed voltage 519 from the first DC voltage supply. In one example, the third sensed voltage 519 is from the first voltage domain. In one example, the first sensed voltage 517, the second sensed voltage 518 and the third sensed voltage 519 are the same sensed voltage from the first DC voltage supply. In one example, the first sensed voltage 517, the second sensed voltage 518 and the third sensed voltage 519 are the same sensed voltage. In one example, the first sensed voltage 517, the second sensed voltage 518 and the third sensed voltage 519 may be sourced by the same monitored DC supply.

In one example, the divided output waveform 523 with the divided output frequency $F_d$ which is lower than the common RO output frequency $F_0$ enables generation of a heartbeat signal 536 after supplying the divided output waveform 523 to a second LS 526. In one example, the frequency divider 514 has greater timing margin than the frequency counter 512 and the comparator 513. In one example, greater timing margin results in resiliency to supply voltage fluctuations in an anomalous operational condition of the first DC voltage supply in the first voltage domain.

In one example, greater timing margin may be achieved by lowering an output frequency of a waveform by frequency division which may be implemented by a circuit allowing greater timing margin (e.g., a chain of divide-by-2 circuits). In one example, using the frequency divider 514 to lower an output frequency from the common RO output frequency $F_0$ to the divided output frequency $F_d$, where $F_d < F_0$, may improve resilience to supply voltage fluctuations in an anomalous operational condition of the first DC voltage supply in the first voltage domain. In one example, the heartbeat signal 536 is more robust than the alarm state signal 535 because the heartbeat signal 536 has a greater timing margin. For example, the heartbeat signal 536 is more resilient than the alarm state signal 535 because the heartbeat signal 536 has a greater timing margin.

In one example, the alarm state signal 535 and the heartbeat signal 536 derived from the monitored subsystem 510 are received by a controller subsystem 530. In one example, the alarm state signal 535 is processed by an alarm processor 531. In one example, the heartbeat signal 536 is processed by a heartbeat detector 532. In one example, the controller subsystem 530 receives a controller voltage from a second DC voltage supply. In one example, the controller voltage is from a second voltage domain. In one example, the second voltage domain is independent of the first voltage domain. In one example, the second DC voltage supply is independent of the first DC voltage supply. In one example, the second voltage domain includes higher integrity voltage supplies with higher availability and higher reliability than in the first voltage domain. In one example, the second voltage domain may be externally monitored for independent validation of its integrity.

In one example, the heartbeat detector 532 receives the heartbeat signal 536 and detects a periodic recurrence of a heartbeat pulse at a rate equivalent to the divided output frequency $F_d$. In one example, the detection determines an integrity of the alarm state signal 535 by presence of the periodic recurrence of the heartbeat pulse. In one example, the heartbeat pulse provides an independent validation of the alarm state signal 535 when the status of the first voltage domain is not known a priori. In one example, upon detection of the periodic recurrence of the heartbeat pulse, the heartbeat detector 532 provides a sensor alive (i.e., sensor in-range) indication signal 533 to the alarm processor 531. For example, a first state of the sensor alive indication signal 533 indicates a functioning voltage sensor for the monitored subsystem 510 if there is presence of the periodic recurrence of the heartbeat pulse. For example, a second state of the sensor alive indication signal 533 indicates a non-functioning voltage sensor for the monitored subsystem 510 if there is absence of the periodic recurrence of the heartbeat pulse.

In one example, the alarm processor 531 receives the sensor alive indication signal 533 from the heartbeat detector 532 to interpret the alarm state signal 535. For example, if the sensor alive indication signal 533 indicates the first state (i.e., functioning voltage sensor), the alarm state signal 535 may be trusted and further interpretation may proceed. For example, if the sensor alive indication signal 533 indicates the second state (i.e., non-functioning voltage sensor), the alarm state signal 535 may not be trusted and no further interpretation should be undertaken.

In one example, the controller subsystem 530 generates a source clock signal 534 which is sent to a third LS 524 to produce a clock signal 521 for the monitored subsystem 510. For example, the clock signal 521 may form a basis signal for the reference clock 527 in the monitored subsystem 510. In one example, the clock signal 521 is a robust clock signal since it is generated in the second voltage domain and is independent of the first voltage domain.

In one example, the alarm processor 531 generates an error interrupt signal 537 and a warning interrupt signal 538 based on the alarm state signal 535 and sends them to a safety processor 540. In one example, the safety processor 540 includes a memory. In one example, the safety processor 540 receives a processor voltage from a third DC voltage supply. In one example, the processor voltage is from the second voltage domain. In one example, the second voltage domain is independent of the first voltage domain. In one example, the third DC voltage supply is independent of the first DC voltage supply. In one example, the third DC voltage supply is the same as the second voltage supply.

In one example, the safety processor 540 sends an alarm message 541 to an external safety monitor system 550. In one example, the alarm message is a synopsis of the error interrupt signal 537 and the warning interrupt signal 538. In one example, the external safety monitor system 550 uses the alarm message 541 for overall situational awareness tasks.

In one example, the example voltage sensor implementation 500 may provide a plurality of error conditions which depend on the alarm state signal 535 and the heartbeat signal 536. In one example, a first error condition of the plurality of error conditions (i.e., a fast indication of sensed voltage violation) may be provided when the controller subsystem 530 is configured and enabled, when an alarm is indicated in the alarm state signal 535 and when the sensor alive indication signal 533 indicates a functioning voltage sensor (i.e., alive). In one example, the alarm state signal 535 is based on the accumulation of phase cycles from the counter and may be used to infer the common RO output frequency $F_0$.

In one example, a second error condition of the plurality of error conditions (i.e., a slow indication of sensed voltage violation) may be provided when the controller subsystem 530 is configured and enabled, when a heartbeat score is outside narrow voltage monitoring limits in the alarm state signal 535 and when the sensor alive indication signal 533 indicates a functioning voltage sensor (i.e., alive).

In one example, a third error condition of the plurality of error conditions (i.e., a general voltage sensor failure) may be provided when the controller subsystem 530 is configured and enabled, and when the sensor alive indication signal 533 indicates a non-functioning voltage sensor (i.e., not alive).

Figure 6:
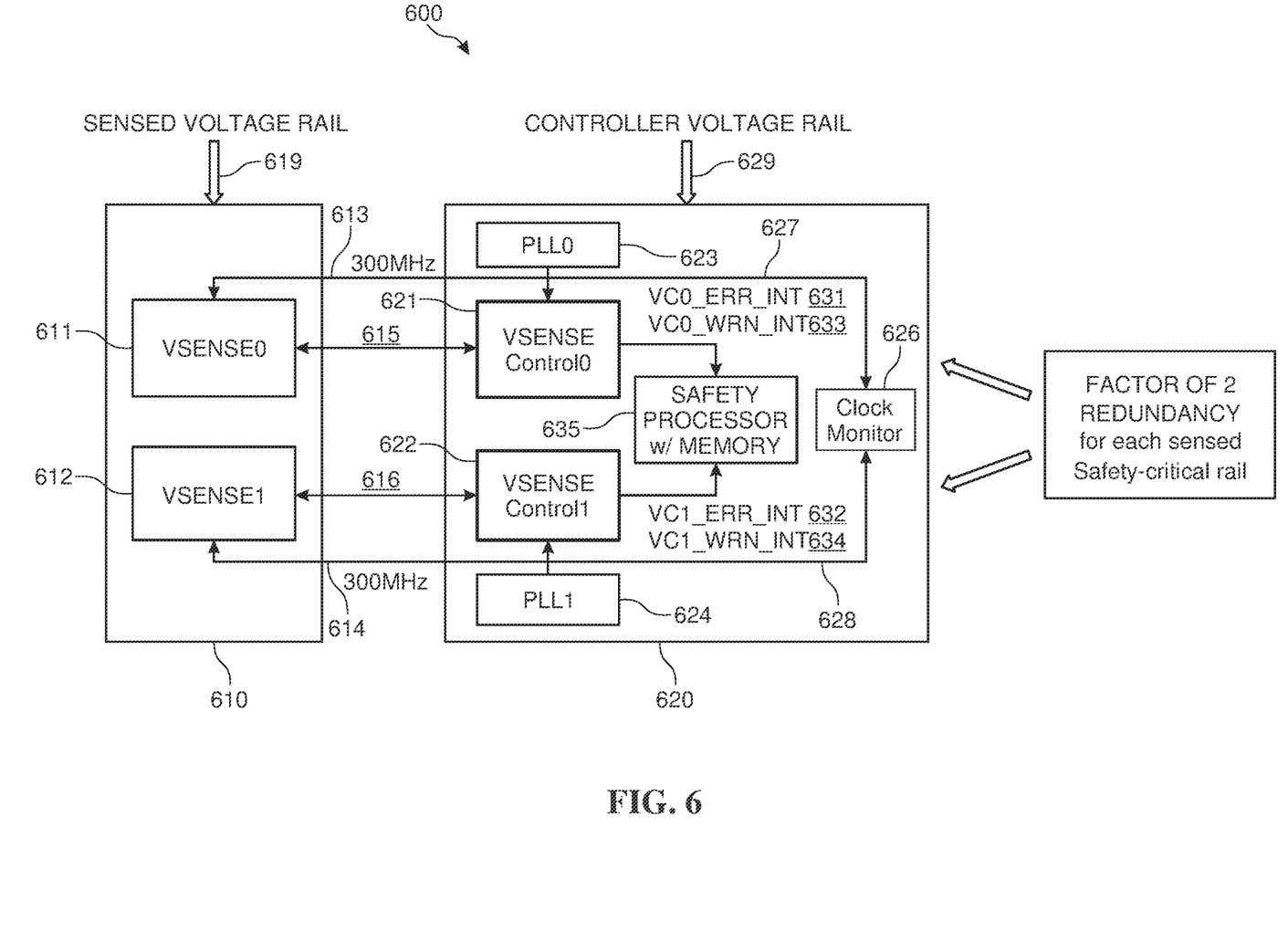
FIG. 6 illustrates a sixth example voltage sensor implementation.

FIG. 6 illustrates a sixth example voltage sensor implementation 600. In one example, a monitored subsystem 610 includes a first voltage sensor 611 and a second voltage sensor 612. In one example, the monitored subsystem 610 receives a first reference clock 613 and a second reference clock 614 from a controller subsystem 620. In one example, the first reference clock 613 is sent to a first controller subsystem 621 in the controller subsystem 620. In one example, the second reference clock 614 is sent to a second controller subsystem 622 in the controller subsystem 620. In one example, the voltage sensor architecture 600 is fully redundant in which all critical subsystems include fully functional backups.

In one example, the monitored subsystem 610 also sends a first plurality of indication signals 615 to the first controller subsystem 621 and a second plurality of indication signals 616 to the second controller subsystem 622. In one example, the first plurality of indication signals 615 includes a first alarm state signal and a first heartbeat signal. In one example, the second plurality of indication signals 616 includes a second alarm state signal and a second heartbeat signal.

In one example, the first reference clock 613 is generated by a first frequency generator 623 and the second reference clock 614 is generated by a second frequency generator 624. In one example, the first frequency generator 623 is a first phase locked loop (PLL) or a first PLL followed by a clock divider. In one example, the second frequency generator 624 is a second phase locked loop (PLL) or a second PLL followed by a clock divider. In one example, the first frequency generator 623 also generates a first monitored clock 627 and the second frequency generator 624 also generates a second monitored clock 628. In one example, the first monitored clock 627 and the second monitored clock 628 is sent to a clock monitor module 626 for independent integrity monitoring of the first frequency generator 623 and of the second frequency generator 624.

In one example, the first controller 621 provides a first error interrupt signal 631 and a first warning interrupt signal 633 to a safety processor 635. In one example, the second controller 622 provides a second error interrupt signal 632 and a second warning interrupt signal 634 to the safety processor 635.

In one example, the monitored subsystem 610 is in a first voltage domain with a sensed voltage rail 619. In one example, the controller subsystem 620 is in a second voltage domain with a controller voltage rail 629. In one example, the example fully redundant voltage sensor architecture 600 provides a factor of two redundancy for each sensed voltage rail (e.g., for each safety-critical voltage rail).

In one example, the controller subsystem 620 may compare the first error interrupt signal 631 from the first controller 621 to the second error interrupt signal 632 from the second controller 622 and compare the first warning interrupt signal 633 from the first controller 621 to the second warning interrupt signal 634 from the second controller 622 to determine which of the first voltage sensor 611 and the second voltage sensor 612 provides a true indication of voltage state. And, in one example, the determination is based on the sensor alive (i.e., sensor in-range) indication signal. In one example, the comparison offers protection from a monitor failure condition (e.g., a frozen state), protection from a transient voltage condition (e.g., a single event upset which cannot be confirmed by a subsequent monitoring, rapid fault message delivery to a safety manager and simple operation. In another example, the controller subsystem 620 may receive the first error interrupt signal 631 and the second error interrupt signal 632 to produce an error indication based on whichever error interrupt signal is received first. In another example, the controller subsystem 620 may receive the first warning interrupt signal 633 and the second warning interrupt signal 634 to produce a warning indication based on whichever warning interrupt signal is received first.

In one example, the example voltage sensor implementation 500 provides a plurality of system responses to voltage sensor events. In one example, the voltage sensor implementation 500 generates the following alarm indications:

Overvoltage alarm (OV alarm) (e.g., fast indication)
Undervoltage alarm (UV alarm) (e.g., fast indication)
Analog-to-digital converter (ADC) code.

In one example, the safety processor 540 (shown in FIG. 5) observes the alarm indications and periodically reads the ADC code from the counter 512. In one example, the ADC code represents the accumulation of phase cycles with R bits of resolution and may be used to determine the common RO output frequency when then determines the voltage level of monitored DC supply. In one example, if the OV alarm or UV alarm is triggered, the safety processor 540 may process this event as a warning state or error state. In one example, the warning state is a first response level where the safety processor 540 may log a diagnostic message and implement a corrective action such as adjusting a DC voltage supply voltage level. For example, in the warning state, the safety processor 540 may record a system state (e.g., temperature, operational frequency, use case, intended voltage sensor, etc.)

In one example, the error state is a second response level where the safety processor 540 can initiate full or partial shutdown of the system and log a maintenance message. In one example, the safety processor 540 can implement a corrective action such as adjusting the DC voltage supply voltage level. For example, in the error state, the safety processor 540 can record the system state (e.g., temperature, operational frequency, use case, intended voltage sensor, etc.

Figure 7:
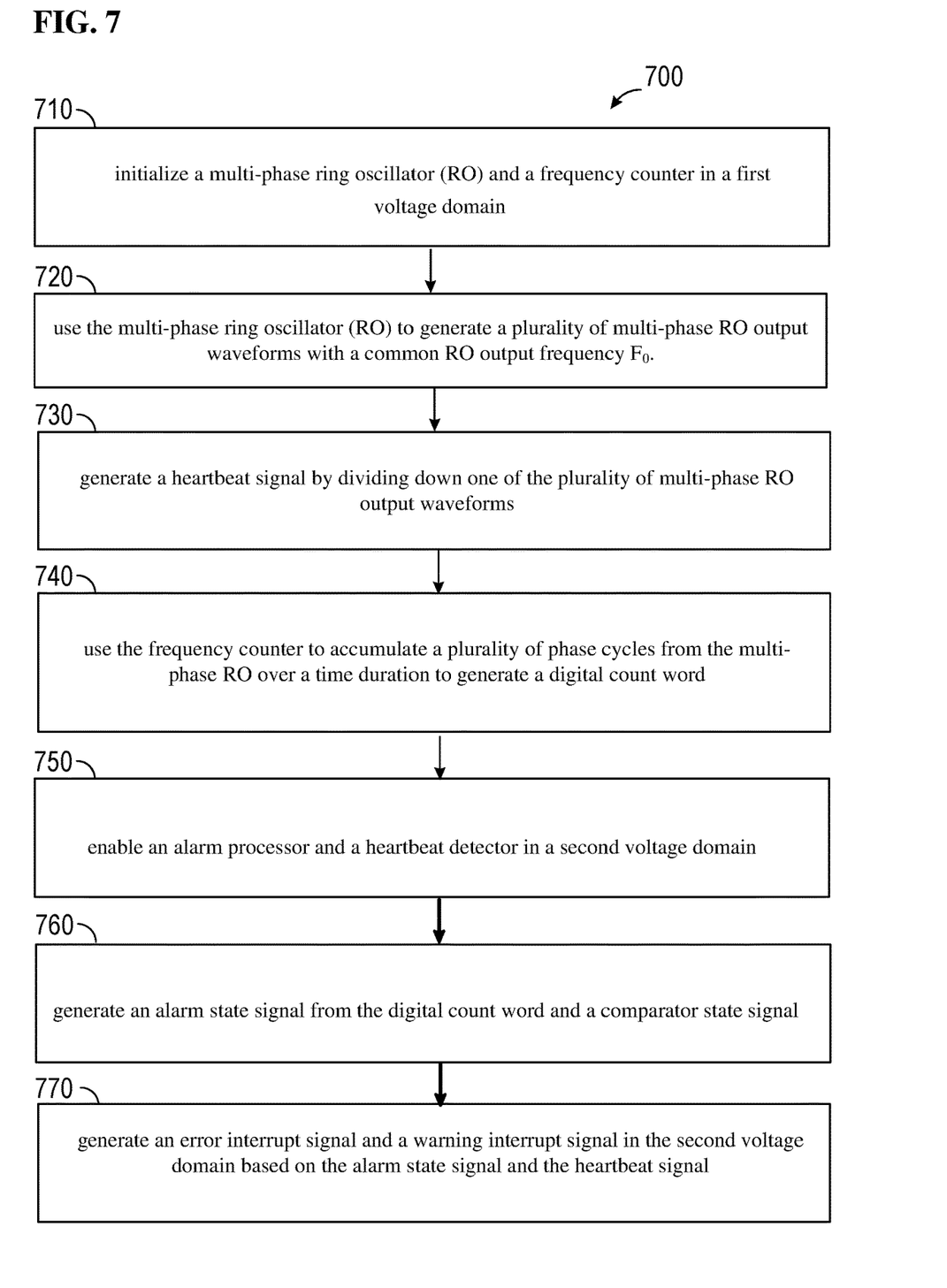
FIG. 7 illustrates an example flow diagram for voltage sensing by a ring oscillator (RO)-based voltage sensing system.

FIG. 7 illustrates an example flow diagram 700 for voltage sensing by a ring oscillator (RO)-based voltage sensing system. In block 710, initialize a multi-phase ring oscillator (RO) and a frequency counter in a first voltage domain. That is, the multi-phase ring oscillator (RO) and the frequency counter are initialized in a first voltage domain. In one example, the multi-phase ring oscillator (RO) receives a sensed voltage from a DC voltage supply. In one example, the sensed voltage is from the first voltage domain. In one example, upon detection of a periodic recurrence of the heartbeat pulse, the heartbeat detector may provide a sensor alive indication signal to an alarm processor.

In block 720, use the multi-phase ring oscillator (RO) to generate a plurality of multi-phase RO output waveforms with a common RO output frequency $F_0$. That is, the multi-phase ring oscillator (RO) generates a plurality of multi-phase RO output waveforms with a common RO output frequency $F_0$. In one example, each of the plurality of multi-phase RO output waveforms has a different waveform phase value.

In block 730, generate a heartbeat signal by dividing down one of the plurality of multi-phase RO output waveforms. That is, a heartbeat signal is generated by dividing down one of the plurality of multi-phase RO output waveforms. In one example, the dividing down produces a divided output waveform with a divided output frequency $F_d$. In one example, the divided output frequency $F_d$ is related to the common RO output frequency $F_0$ by a dividing integer P. In one example, the heartbeat signal has greater timing margin than the alarm state signal. In one example, the value of P depends on one or more of the following: electronic components, clock frequency, user application, phase noise, etc. of a RO-based voltage sensing system.

In block 740, use the frequency counter to accumulate a plurality of phase cycles from the multi-phase RO over a time duration to generate a digital count word. That is, the frequency counter accumulates a plurality of phase cycles from the multi-phase RO over a time duration to generate a digital count word. In one example, the digital count word may be used to determine voltage level of monitored DC supply.

In block 750, enable an alarm processor and a heartbeat detector in a second voltage domain. That is, the alarm processor and the heartbeat detector are enabled in a second voltage domain. In one example, the heartbeat detector detects a periodic recurrence of a heartbeat pulse at a rate equivalent to a divided output frequency $F_d$. In one example, the alarm processor processes an alarm state signal. In one example, the heartbeat detector processes the heartbeat signal. In one example, the alarm processor validates the periodic recurrence of the heartbeat pulse to be within a target recurrence range (e.g., between a minimum periodic recurrence and a maximum periodic recurrence). If the periodic recurrence is validated, the alarm processor is enabled to commence monitoring of the alarm state signal.

In block 760, generate an alarm state signal from the digital count word and a comparator state signal. That is, the alarm state signal is generated from the digital count word and a comparator state signal. In one example, the comparator state signal is based on a comparison between the digital count word and a count threshold. In one example, the alarm state signal indicates an overvoltage condition or an undervoltage condition, and an analog-to-digital converter (ADC) code. In one example, the ADC code represents the digital count word.

In block 770, generate an error interrupt signal and a warning interrupt signal in the second voltage domain based on the alarm state signal and the heartbeat signal. In one example, the heartbeat signal includes recurrence of a heartbeat pulse at a rate equivalent to the divided output frequency $F_d$. In one example, detection of the heartbeat pulse provides an independent validation of the alarm state signal. In one example, detection of the heartbeat pulse indicates a functioning RO-based voltage sensing system. In one example, lack of detection of the heartbeat pulse indicates a non-functioning RO-based voltage sensing system. In one example, the RO-based voltage sensing system is the voltage sensor implementation 500 (shown in FIG. 5).

In one example, the second voltage domain is separate from the first voltage domain. In one example, the second voltage domain includes higher integrity voltage supplies with higher availability and higher reliability than in the first voltage domain.

In one aspect, one or more of the steps for providing voltage sensing for safety-critical applications in FIG. 7 may be executed by one or more processors which may include hardware, software, firmware, etc. The one or more processors, for example, may be used to execute software or firmware needed to perform the steps in the flow diagram of FIG. 7. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

One skilled in the art would understand that various features of different embodiments may be combined or modified and still be within the spirit and scope of the present disclosure.

What is claimed is:

1. An apparatus comprising:
   a multi-phase ring oscillator (RO) configured to operate in a first voltage domain;
   a frequency counter coupled to the multi-phase RO, the frequency counter configured to accumulate a plurality of phase cycles from the multi-phase RO over a time duration to generate a digital count word;
   an alarm processor coupled to the frequency counter, the alarm processor configured to receive an alarm state signal from the frequency counter; and
   a heartbeat detector coupled to the multi-phase RO, the heartbeat detector configured to operate in a second voltage domain and configured to detect a periodic recurrence of a heartbeat pulse to determine an integrity of the alarm state signal and an overall sensor operation.

2. The apparatus of claim 1, wherein the alarm processor is configured to operate in the second voltage domain.

3. The apparatus of claim 2, wherein the frequency counter is configured to operate in the first voltage domain.

4. The apparatus of claim 3, wherein the second voltage domain is separate from the first voltage domain.

5. The apparatus of claim 4, wherein the second voltage domain includes higher integrity voltage supplies with higher availability and higher reliability than in the first voltage domain.

6. The apparatus of claim 1, wherein the alarm state signal indicates an overvoltage condition or an undervoltage condition, and an analog-to-digital converter (ADC) code.

7. The apparatus of claim 6, wherein the ADC code represents the digital count word.

8. The apparatus of claim 1, further comprising a frequency divider coupled to the heartbeat detector, the frequency divider configured to generate a heartbeat signal.

9. The apparatus of claim 8, wherein the multi-phase RO, the frequency counter and the frequency divider are housed in a monitored subsystem.

10. The apparatus of claim 9, wherein the heartbeat signal includes a recurrence of the heartbeat pulse to indicate that the monitored subsystem is functional.

11. An apparatus for voltage sensing, the apparatus comprising:
    generating an alarm state signal from a digital count word and a comparator state signal;
    generating a heartbeat signal by dividing down one of a plurality of multi-phase ring oscillator (RO) output waveforms in a first voltage domain;
    generating an error interrupt signal and a warning interrupt signal in a second voltage domain based on the alarm state signal and the heartbeat signal;
    accumulating a plurality of phase cycles from a multi-phase ring oscillator (RO) over a time duration to generate the digital count word; and
    wherein the heartbeat signal has greater timing margin than the alarm state signal, and wherein each of the plurality of multi-phase RO output waveforms has a different waveform phase value.

12. The apparatus of claim 11, wherein the second voltage domain is separate from the first voltage domain, and wherein the second voltage domain includes higher integrity voltage supplies with higher availability and higher reliability than in the first voltage domain.

13. A non-transitory computer-readable medium storing computer executable code, operable on a device comprising at least one processor and at least one memory coupled to the at least one processor, wherein the at least one processor is configured to implement voltage sensing, the computer executable code comprising:
    instructions for causing a computer to generate an alarm state signal from a digital count word and a comparator state signal;
    instructions for causing the computer to generate a heartbeat signal by dividing down one of a plurality of multi-phase ring oscillator (RO) output waveforms in a first voltage domain;
    instructions for causing the computer to generate an error interrupt signal and a warning interrupt signal in a second voltage domain based on the alarm state signal and the heartbeat signal;
    instructions for causing the computer to accumulate a plurality of phase cycles from a multi-phase ring oscillator (RO) over a time duration to generate the digital count word; and
    wherein the heartbeat signal has greater timing margin than the alarm state signal, and wherein each of the plurality of multi-phase RO output waveforms has a different waveform phase value.

14. The non-transitory computer-readable medium of claim 13, wherein the second voltage domain is separate from the first voltage domain, and wherein the second voltage domain includes higher integrity voltage supplies with higher availability and higher reliability than in the first voltage domain.

* * * * *